(12) United States Patent
Wackwitz et al.

(10) Patent No.: US 9,461,281 B2
(45) Date of Patent: Oct. 4, 2016

(54) BATTERY RETENTION SYSTEM FOR A POWER TOOL

(75) Inventors: Jeffrey M. Wackwitz, Pewaukee, WI (US); Jeremy R. Ebner, Pewaukee, WI (US)

(73) Assignee: MILWAUKEE ELECTRIC TOOL CORPORATION, Brookfield, WI (US)

(*) Notice: Subject to any disclaimer, the term of this patent is extended or adjusted under 35 U.S.C. 154(b) by 281 days.

(21) Appl. No.: 13/878,312

(22) PCT Filed: Oct. 7, 2011

(86) PCT No.: PCT/US2011/055396
§ 371 (c)(1),
(2), (4) Date: Apr. 8, 2013

(87) PCT Pub. No.: WO2012/048240
PCT Pub. Date: Apr. 12, 2012

(65) Prior Publication Data
US 2013/0196203 A1    Aug. 1, 2013

Related U.S. Application Data

(60) Provisional application No. 61/391,381, filed on Oct. 8, 2010.

(51) Int. Cl.
*H01M 2/10*  (2006.01)
*B25F 5/00*  (2006.01)
*G01R 1/04*  (2006.01)
(Continued)

(52) U.S. Cl.
CPC ............ *H01M 2/1022* (2013.01); *B25F 5/00* (2013.01); *H01M 2/1055* (2013.01); *B25F 5/02* (2013.01); *G01R 1/04* (2013.01); *G01R 1/0408* (2013.01); *G01R 1/22* (2013.01); *H01M 10/0525* (2013.01);
(Continued)

(58) Field of Classification Search
None
See application file for complete search history.

(56) References Cited

U.S. PATENT DOCUMENTS 3,186,878 A    6/1965   Filander
3,999,110 A    12/1976  Ramstrom et al.
(Continued)

FOREIGN PATENT DOCUMENTS

DE    19521423    12/1996
DE    102004044331   3/2006
(Continued)

OTHER PUBLICATIONS

PCT/US2011/055369 International Search Report and Written Opinion dated May 29, 2012 (7 pages).
(Continued)

*Primary Examiner* — Carlos Barcena
*Assistant Examiner* — Wojciech Haske
(74) *Attorney, Agent, or Firm* — Michael Best & Friedrich LLP

(57) ABSTRACT

A battery retention system for a power tool having a motor, a drive mechanism coupled to the motor, and an output element coupled to the drive mechanism. The battery retention system includes a battery pack for powering the motor, the battery pack being removably coupled to the power tool. The battery retention mechanism also includes a first mating feature for coupling the battery pack to the power tool and a second mating feature for coupling the battery pack to the power tool independently from the first mating feature. The second mating feature is configured to couple the battery pack to the power tool when the first mating feature is disengaged.

14 Claims, 7 Drawing Sheets

(51) Int. Cl.
   *H01M 10/48* (2006.01)
   *B25F 5/02* (2006.01)
   *G01R 1/22* (2006.01)
   *H01M 10/0525* (2010.01)

(52) U.S. Cl.
   CPC ....... *H01M 10/488* (2013.01); *H01M 2220/30* (2013.01); *Y02E 60/12* (2013.01)

(56) References Cited

U.S. PATENT DOCUMENTS

| | | |
|---|---|---|
| 4,678,215 A | 7/1987 | Rehbein et al. |
| 4,835,410 A | 5/1989 | Bhagwat et al. |
| 4,863,812 A | 9/1989 | Ueda et al. |
| 4,871,629 A | 10/1989 | Bunyea |
| 4,880,713 A | 11/1989 | Levine |
| D313,391 S | 1/1991 | Pudwill |
| 5,011,424 A | 4/1991 | Simmons |
| 5,116,699 A | 5/1992 | Miyajima |
| 5,202,197 A | 4/1993 | Ansell et al. |
| 5,213,913 A | 5/1993 | Anthony, III et al. |
| 5,225,293 A | 7/1993 | Mitchell et al. |
| 5,334,041 A | 8/1994 | Anbo et al. |
| 5,368,954 A | 11/1994 | Bruns |
| 5,400,987 A | 3/1995 | Ziavras |
| 5,401,592 A | 3/1995 | Gilpin et al. |
| 5,415,955 A | 5/1995 | Kobayashi et al. |
| 5,484,223 A | 1/1996 | Saito |
| 5,486,117 A | 1/1996 | Chang |
| 5,553,675 A | 9/1996 | Pitzen et al. |
| 5,589,288 A | 12/1996 | Coulson et al. |
| 5,604,050 A | 2/1997 | Brunette et al. |
| 5,607,792 A | 3/1997 | Garcia et al. |
| 5,621,618 A | 4/1997 | Komiyama |
| D379,795 S | 6/1997 | Pitzen et al. |
| 5,663,011 A | 9/1997 | Bunyea et al. |
| 5,671,815 A | 9/1997 | Kabatnik et al. |
| 5,681,667 A | 10/1997 | Bunyea et al. |
| 5,683,831 A | 11/1997 | Baril et al. |
| 5,718,985 A | 2/1998 | Bunyea et al. |
| 5,741,305 A | 4/1998 | Bincent et al. |
| 5,792,573 A | 8/1998 | Pitzen et al. |
| 5,800,940 A | 9/1998 | Bunyea et al. |
| 5,856,038 A | 1/1999 | Mason |
| 6,146,182 A | 11/2000 | Wang et al. |
| 6,168,881 B1 | 1/2001 | Fischer et al. |
| 6,376,942 B1 | 4/2002 | Burger et al. |
| 6,412,572 B2 | 7/2002 | Habedank et al. |
| 6,656,626 B1 | 12/2003 | Mooty et al. |
| 6,840,335 B1 | 1/2005 | Wu |
| 6,878,006 B1 | 4/2005 | Heidenreich et al. |
| 7,125,270 B2 | 10/2006 | Buck et al. |
| 7,128,595 B2 | 10/2006 | Boutros |
| RE40,681 E | 3/2009 | Pitzen et al. |
| RE40,848 E | 7/2009 | Pitzen et al. |
| 7,619,387 B2 | 11/2009 | Amend et al. |
| 7,632,132 B2 | 12/2009 | Nishio et al. |
| 7,648,383 B2 | 1/2010 | Matthias et al. |
| 7,661,486 B2 | 2/2010 | Turner et al. |
| 7,766,097 B2 | 8/2010 | Kondo |
| 7,828,185 B2 | 11/2010 | Hoffmann et al. |
| 2008/0099224 A1 | 5/2008 | Hofmann et al. |
| 2008/0226971 A1 | 9/2008 | Stickel |
| 2008/0302552 A1* | 12/2008 | Kondo ................ H01M 2/1066 173/217 |
| 2009/0180829 A1 | 7/2009 | Rejman et al. |
| 2009/0229842 A1 | 9/2009 | Gray et al. |
| 2010/0000067 A1 | 1/2010 | Turner et al. |
| 2010/0224666 A1 | 9/2010 | Miyata |

FOREIGN PATENT DOCUMENTS

| | | |
|---|---|---|
| DE | 102005008036 | 8/2006 |
| DE | 102005036449 | 2/2007 |
| EP | 1620233 | 2/2006 |

OTHER PUBLICATIONS

European Extended Search Report for Application No. 11831691.8 dated Jan. 13, 2015 (9 pages).

* cited by examiner

BATTERY RETENTION SYSTEM FOR A POWER TOOL

RELATED APPLICATIONS

This application claims priority to U.S. Provisional Patent Application No. 61/391,381 filed on Oct. 8, 2010, the entire contents of which are incorporated herein by reference.

BACKGROUND

The present invention relates to a battery retention system for retaining a battery pack in a power tool.

A battery pack may be connected to a power tool such as a screwdriver, a drill, an impact driver, a ratchet, a reciprocating saw, etc. to provide power to the tool. Such power tools include a motor and typically generate vibrations as a result of use. A battery pack is typically retained in the tool by way of a latch mechanism. The latch mechanism is subject to possible failure due to fatigue, particularly when used in tools that generate vibrations.

SUMMARY

In one aspect, the invention provides a battery retention system for a power tool having a motor, a drive mechanism coupled to the motor, and an output element coupled to the drive mechanism. The battery retention system includes a battery pack for powering the motor. The battery pack is removably coupled to the power tool. The battery retention mechanism also includes a first mating feature for coupling the battery pack to the power tool and a second mating feature for coupling the battery pack to the power tool independently from the first mating feature. The second mating feature is configured to couple the battery pack to the power tool when the first mating feature is disengaged.

In another aspect, the invention provides a battery retention system for a power tool. The battery retention system includes a power tool having a motor, a drive mechanism coupled to the motor, and an output element coupled to the drive mechanism. The battery retention system also includes a battery pack for powering the motor, the battery pack being removably coupled to the power tool. The battery retention system also includes a first mating feature associated with the power tool and received by the battery pack for coupling the battery pack to the power tool and a second mating feature associated with the battery pack and received by the power tool for coupling the battery pack to the power tool. One of the first mating feature and the second mating feature is configured to provide a backup to the other of the first mating feature and the second mating feature in the event that the other of the first mating feature and the second mating feature is disengaged.

In yet another aspect, the invention provides a battery retention system for a power tool. The battery retention system includes a power tool having a motor, a drive mechanism coupled to the motor, and an output element coupled to the drive mechanism. The battery retention system also includes a battery pack for powering the motor, the battery pack being removably coupled to the power tool, a rail disposed on one of the battery pack and the power tool, a latch disposed on one of the battery pack and the power tool, and a latch contact surface for receiving the latch to hold the battery pack with respect to the power tool. The battery retention system also includes a spring having at least one spring arm for engaging the rail to hold the battery pack with respect to the power tool. The latch holds the battery pack with respect to the power tool independently of the spring.

Other aspects of the invention will become apparent by consideration of the detailed description and accompanying drawings.

Before any constructions of the invention are explained in detail, it is to be understood that the invention is not limited in its application to the details of construction and the arrangement of components set forth in the following description or illustrated in the following drawings. The invention is capable of other constructions and of being practiced or of being carried out in various ways. Also, it is to be understood that the phraseology and terminology used herein are for the purpose of description and should not be regarded as limiting.

DETAILED DESCRIPTION

Figure 1:
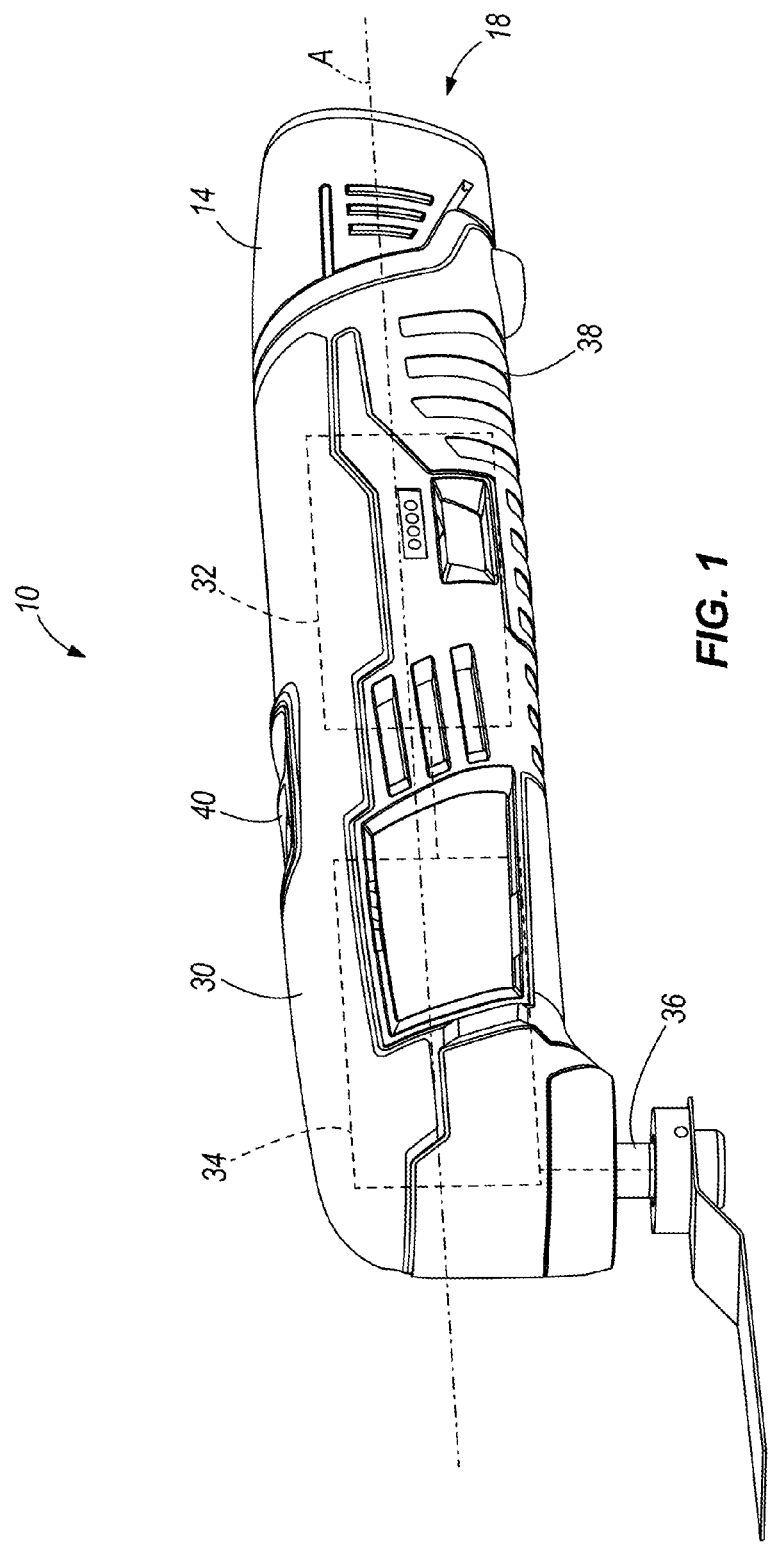
FIG. 1 is a perspective view of a power tool having a battery pack and a battery retention system embodying the invention.
Figure 2:
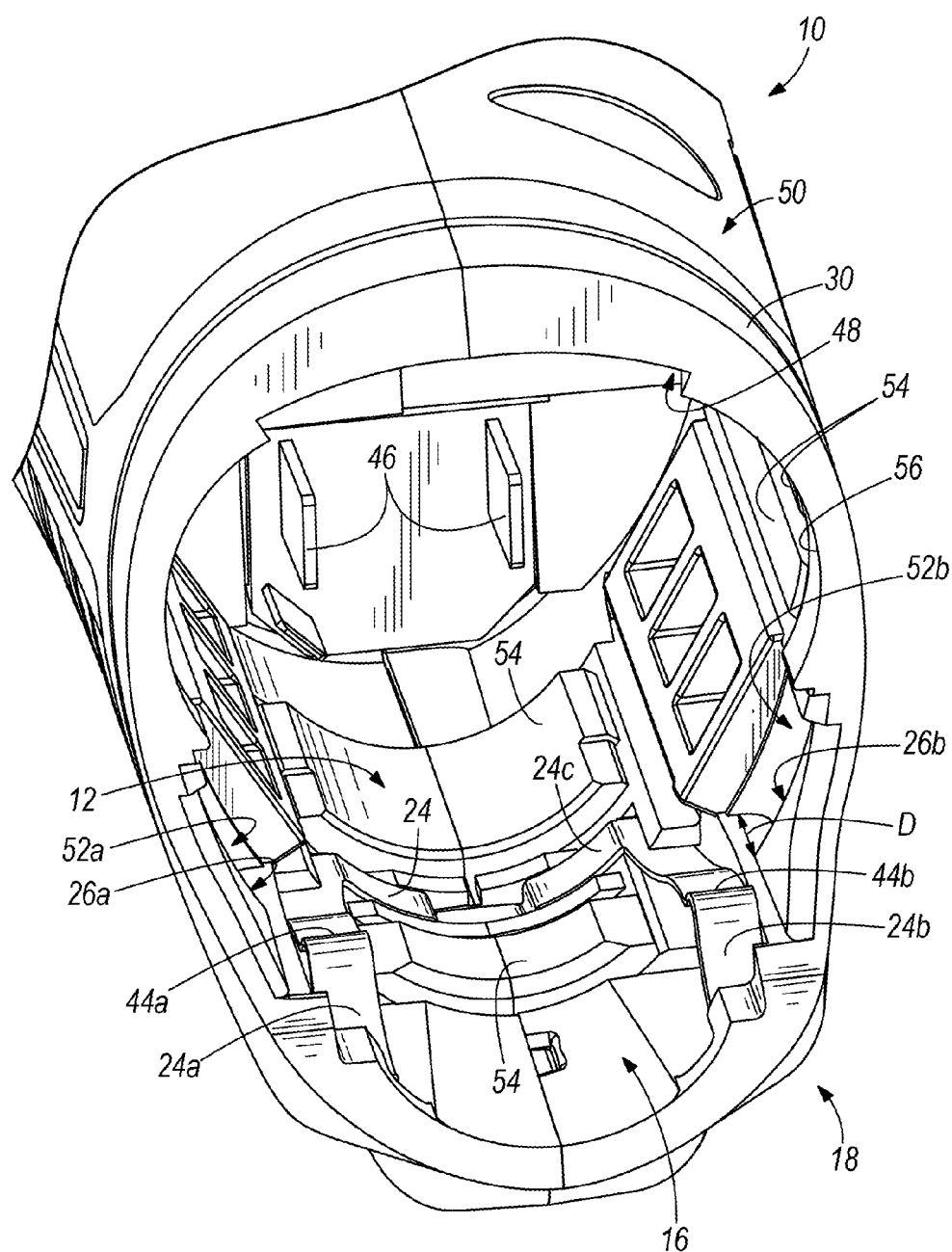
FIG. 2 is a perspective view of a portion of the power tool of FIG. 1 having the battery retention system.
Figure 3:
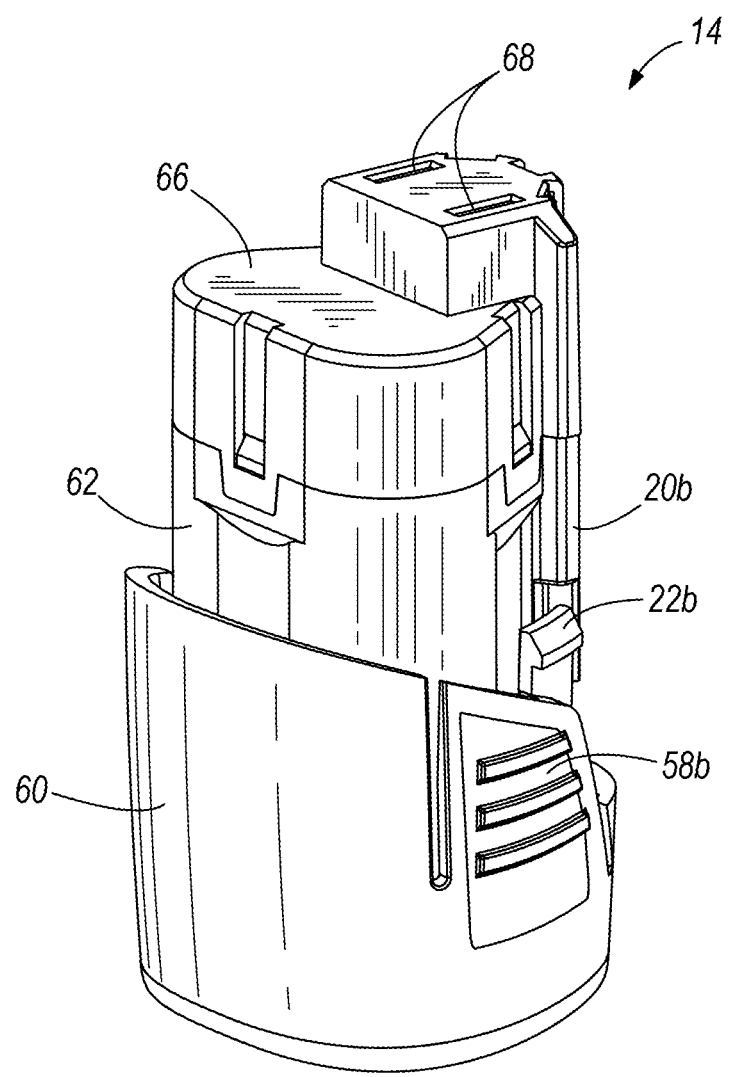
FIG. 3 is a perspective view of the battery pack of FIG. 1.
Figure 6:
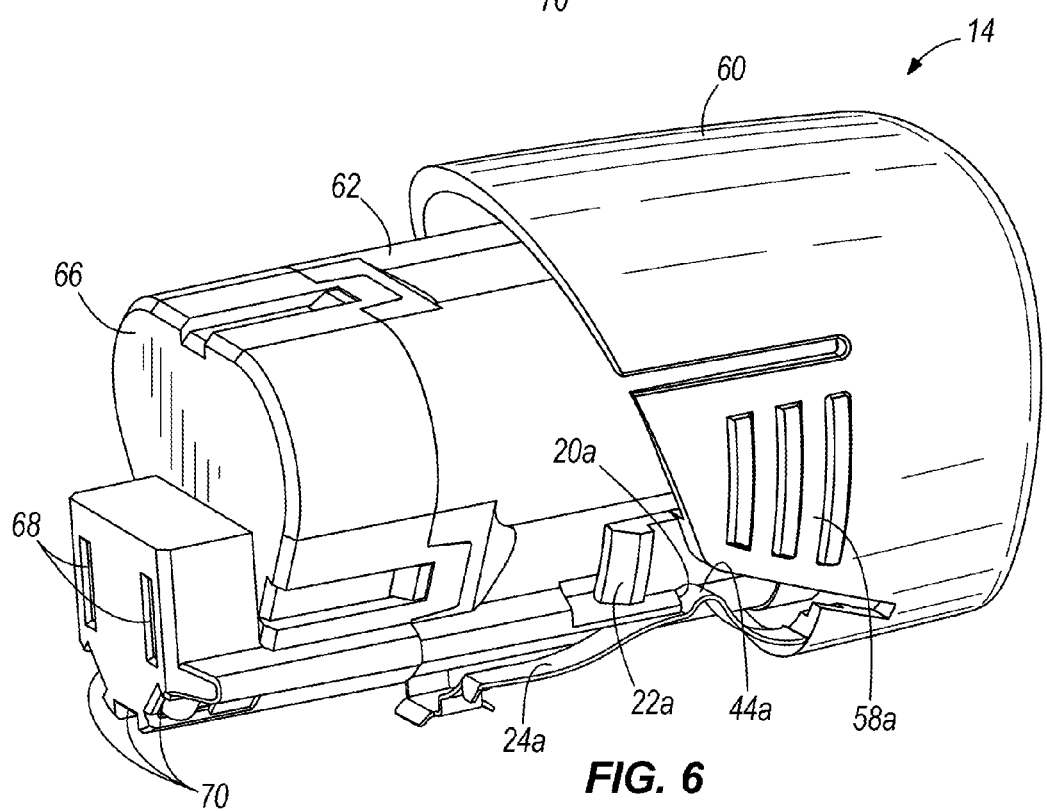
FIG. 6 is a perspective view of the battery pack of FIG. 3 including a portion of the battery retention system.
Figure 7:
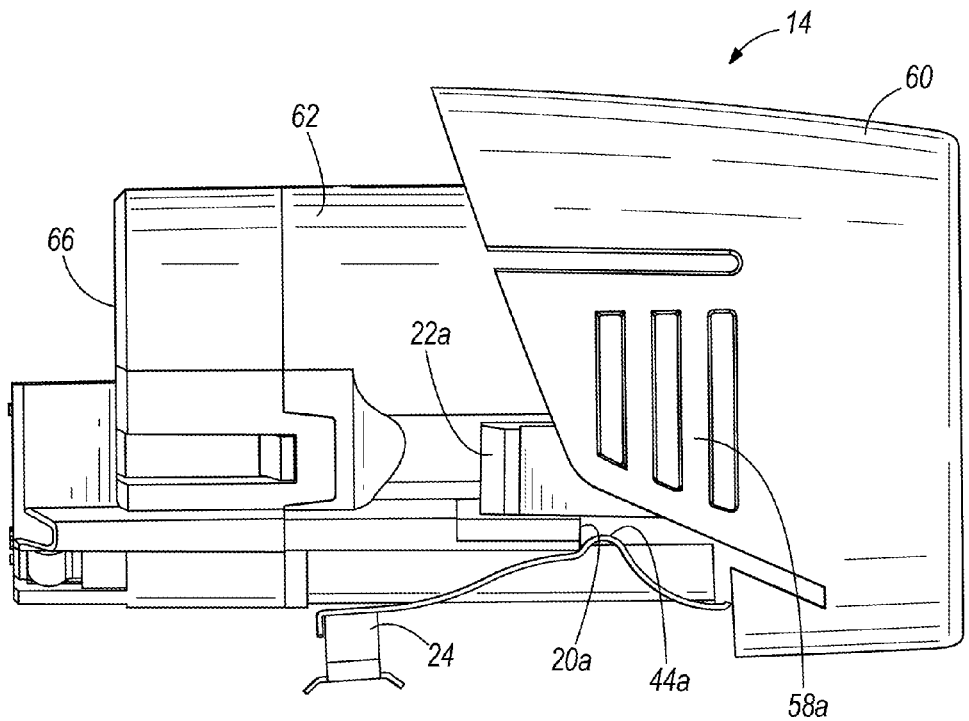
FIG. 7 is a side view of the battery pack of FIG. 3 including a portion of the battery retention system.
Figure 8:
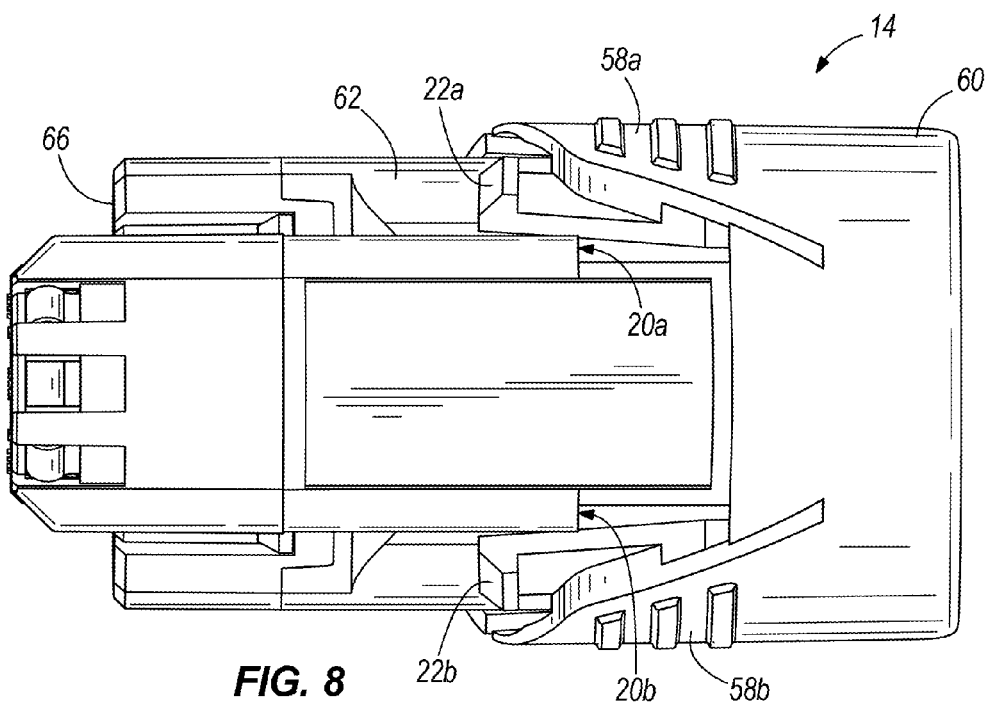
FIG. 8 is a bottom view of the battery pack of FIG. 3.

FIGS. 1-8 illustrate a tool 10 having a battery retention system 12 and a battery pack 14 received and retained by the battery retention system 12. With reference to FIG. 2, the battery retention system 12 includes a cavity 16 located in a distal end 18 of the tool 10 for receiving the battery pack 14. With reference to FIG. 8, the battery pack 14 includes rails 20a, 20b and a pair of latches 22a, 22b. A biasing member 24 is disposed in the cavity 16 for engaging the rails 20a, 20b to retain the battery pack 14, and a pair of latch contact surfaces 26a, 26b are recessed into the tool 10 adjacent the cavity 16 for receiving and engaging the latch 22a, 22b if the biasing member 24 fails, thus providing a secondary retaining mechanism, as will be described in greater detail below.

Figure 9:
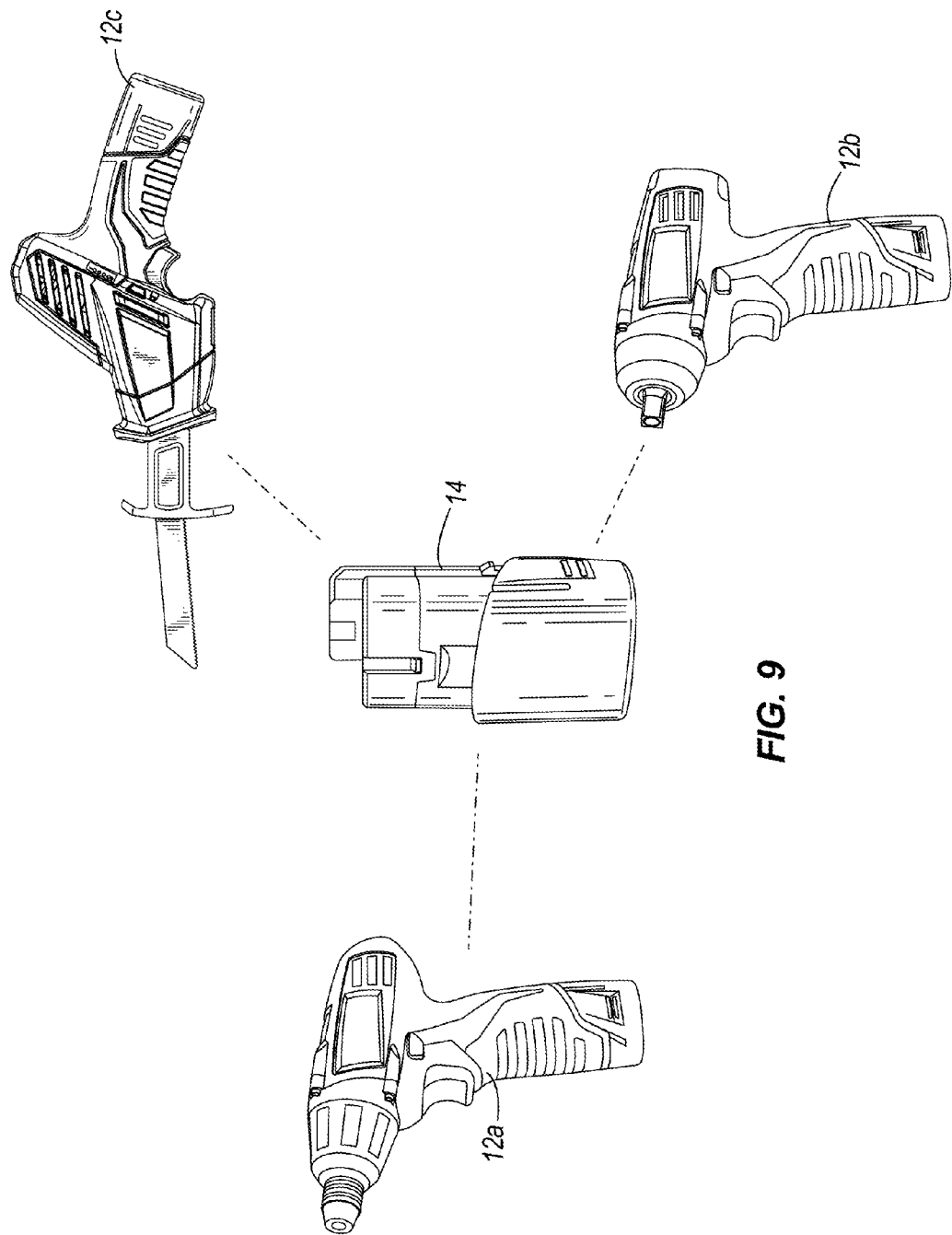
FIG. 9 illustrates a battery pack for use with a variety of tools employing the battery retention system of FIGS. 1-8.

In the illustrated construction, the tool 10 is a battery-powered multi-tool (FIG. 1). In other constructions, the battery retention system 12 may be employed with other types of battery-powered tools, particularly with tools having a motor such that the battery is subjected to vibrations from use of the tool. For example, other tools for applications such as drilling, fastening, cutting, and material removal may be employed. For example, as illustrated in FIG. 9, the battery retention system 12 may be employed with battery-powered drills 12a, impact drivers 12b, ratchet wrenches (not illustrated) and reciprocating saws 12c.

With reference to FIG. 1, the tool 10 includes a housing 30, a motor 32 positioned substantially within the housing 30, a drive mechanism 34 mechanically coupled to the motor 32, and an output element 36 mechanically coupled to the drive mechanism 34. The motor 32 is operable to drive the drive mechanism 34, such as an eccentric drive mechanism, and the output element 36, such as an oscillating member of an oscillating tool, as illustrated. The output element 36 produces an output force when driven by the drive mechanism 34. It is to be understood that in other constructions, other drive mechanisms, such as gear reduction systems, and other output elements, such as a screw driver bit, may be employed, as discussed above.

The tool 10 also includes a grip 38 formed in the housing 30 and a switch 40 supported by the housing 30 generally opposite the grip 38. The switch 40 is electrically coupled between the battery pack 14 and the motor 32 to selectively provide power to the motor 32. Actuating the switch 40 thereby controls operation of the tool 10 by powering the motor 32 which in turn drives the output element 36.

As illustrated in FIG. 2, the biasing member 24 is disposed in the cavity 16 proximate the distal end 18 of the tool 10 and is formed as a single piece, such as from a metal, although other suitable materials may be used in other constructions. The biasing member 24 includes a first spring arm 24a, a second spring arm 24b and a cross member 24c connecting the first spring arm 24a and the second spring arm 24b. The spring arms 24a, 24b generally extend parallel to a central or longitudinal axis A (FIG. 1) of the tool 10 and extend from the cross member 24c generally towards the distal end 18 of the tool 10. Each spring arm 24a, 24b includes a respective projection 44a, 44b extending into the cavity 16 and generally transverse to, and more specifically generally perpendicular to, the longitudinal axis A for engaging the rails 20a, 20b, respectively, of the battery pack 14 in a primary locking engagement. In other constructions, the first and second spring arms 24a, 24b may be formed from separate pieces of material such that the biasing member 24 is formed from multiple pieces.

A pair of terminals 46 are disposed in the cavity 16 and extend into the cavity 16 towards the distal end 18 and generally parallel to the longitudinal axis A. The terminals 46 are for electrically connecting the tool 10 to the battery pack 14, as will be described in greater detail below.

With further reference to FIG. 2, the housing 30 has an inner surface 48 and an outer surface 50. The latch contact surface 26a, 26b is located on the inner surface 48 adjacent a latch-receiving recess 52a, 52b. The latch-receiving recess 52a, 52b includes a depth D measured generally parallel to the longitudinal axis A of the tool 10 between the latch contact surface 26 and an opposite surface adjacent the latch-receiving recess 52a, 52b, as shown in FIG. 2. The depth D is dimensioned such that the latch contact surface 26a, 26b does not lockingly engage the latch 22a, 22b of the battery pack 14 if the biasing member 24 is in locking engagement with the battery pack 14. The depth D is dimensioned such that the latch contact surface 26a, 26b forms a locking engagement with the latch 22a, 22b of the battery pack 14 if the biasing member 24 fails. Thus, the biasing member 24 provides a primary locking engagement mechanism and the latch contact surface 26 provides a conditional secondary locking engagement mechanism only. That is, the secondary locking engagement mechanism only acts as a locking engagement mechanism when the primary locking engagement mechanism fails. Thus, the secondary locking engagement mechanism is provided as a backup for the primary locking engagement mechanism. In other constructions, the primary locking engagement mechanism and the secondary locking engagement mechanism may act simultaneously to provide a locking engagement between the battery pack 14 and the tool 10.

The battery retention system 12 also includes rubber pads 54 disposed on the inner surface 48 of the housing 30 for cushioning the battery pack 14 against vibrations of the tool 10. The rubber pads 54 may be overmolded into the inner surface 48 of the housing 30. In other constructions, the rubber pads 54, or cushions, may be formed of other elastic or dampening materials such as silicone, polyurethane elastomer, and other suitable polymers. The battery retention system 12 also includes a chamfer 56 adjacent an edge of the housing 30 defining the distal end 18. The chamfer 56 provides a lead-in to the cavity 16 for inhibiting the rubber pads 54 from lifting when the battery pack 14 is inserted into the cavity 16. Furthermore, the chamfer 56 centers the battery pack 14 to inhibit the battery pack 14 from being twistable, or rotatable, as it is removed from the cavity 16.

FIGS. 3-8 illustrate the battery pack 14 for use with the tool 10. In the illustrated construction, the battery pack 14 is a lithium-based, rechargeable battery pack and is removably and interchangeably connected to the tool 10 to provide power during operation and to facilitate recharging of the battery pack 14 when not in use. In some constructions, the battery pack 14 may be used with other types of cordless, battery-powered tools or devices not specifically discussed herein.

The illustrated battery pack 14 includes a casing 62, an outer housing 60 coupled to the casing 62, and a plurality of battery cells 64 (FIG. 4) positioned within the casing 62. The casing 62 is shaped and sized to fit within the cavity 16 in the tool 10 to connect the battery pack 14 to the tool 10. The casing 62 includes an end cap 66 to substantially enclose the battery cells 64 within the casing 62. The illustrated end cap 66 includes two power terminals 68 configured to mate with corresponding power terminals 78 extending from the tool 10. In other constructions, the end cap 66 may include terminals that extend from the battery pack 14 and are configured to be received in receptacles supported by the tool 10. The end cap 66 also includes sense or communication terminals 70 (shown in FIG. 5) that are configured to mate with corresponding terminals from the tool 10. The terminals 70 couple to a battery circuit (not shown). The battery circuit can be configured to monitor various aspects of the battery pack 14, such as pack temperature, pack and/or cell state of charge, etc. and can also be configured to send and/or receive information and/or commands to and/or from the tool 10. In one construction, the battery circuit operates as illustrated and described in U.S. Pat. No. 7,157,882 entitled "METHOD AND SYSTEM FOR BATTERY PROTECTION EMPLOYING A SELECTIVELY-ACTUATED SWITCH," issued Jan. 2, 2007, the entire contents of which are hereby incorporated by reference. In another construction, the battery circuit operates as illustrated and described in U.S. Pat. No. 7,589,500 entitled "METHOD AND SYSTEM FOR BATTERY PROTECTION," issued Sep. 15, 2009, the entire contents of which are also hereby incorporated by reference.

The casing 62 and the receptacles 72 substantially enclose and cover the terminals 46 on the tool 10 when the pack 14 is positioned within the cavity 16. That is, the battery pack 14 functions as a cover for the cavity 16 and terminals 46 of the tool 10. Once the battery pack 14 is disconnected from the tool 10 and the casing 62 is removed from the opening, the battery terminals 46 on the tool 10 are generally exposed to the surrounding environment, as shown in FIG. 2.

The outer housing 60 is coupled to an end of the casing 62 substantially opposite the end cap 66 and surrounds a portion of the casing 62. In the illustrated construction, when the casing 62 is inserted into or positioned within the corresponding cavity 16 in the tool 10, the outer housing 60 generally aligns with the outer surface 50 of the tool 10. In this construction, the outer housing 60 is designed to substantially follow the contours of the tool 10 to match the general shape of the tool 10. In some constructions, such as the illustrated construction, the casing 62 is inserted into the grip portion 38 of the power tool 10. In such constructions, the outer housing 60 generally increases (e.g., extends) the length of the grip 38 of the tool 10.

Figure 4:
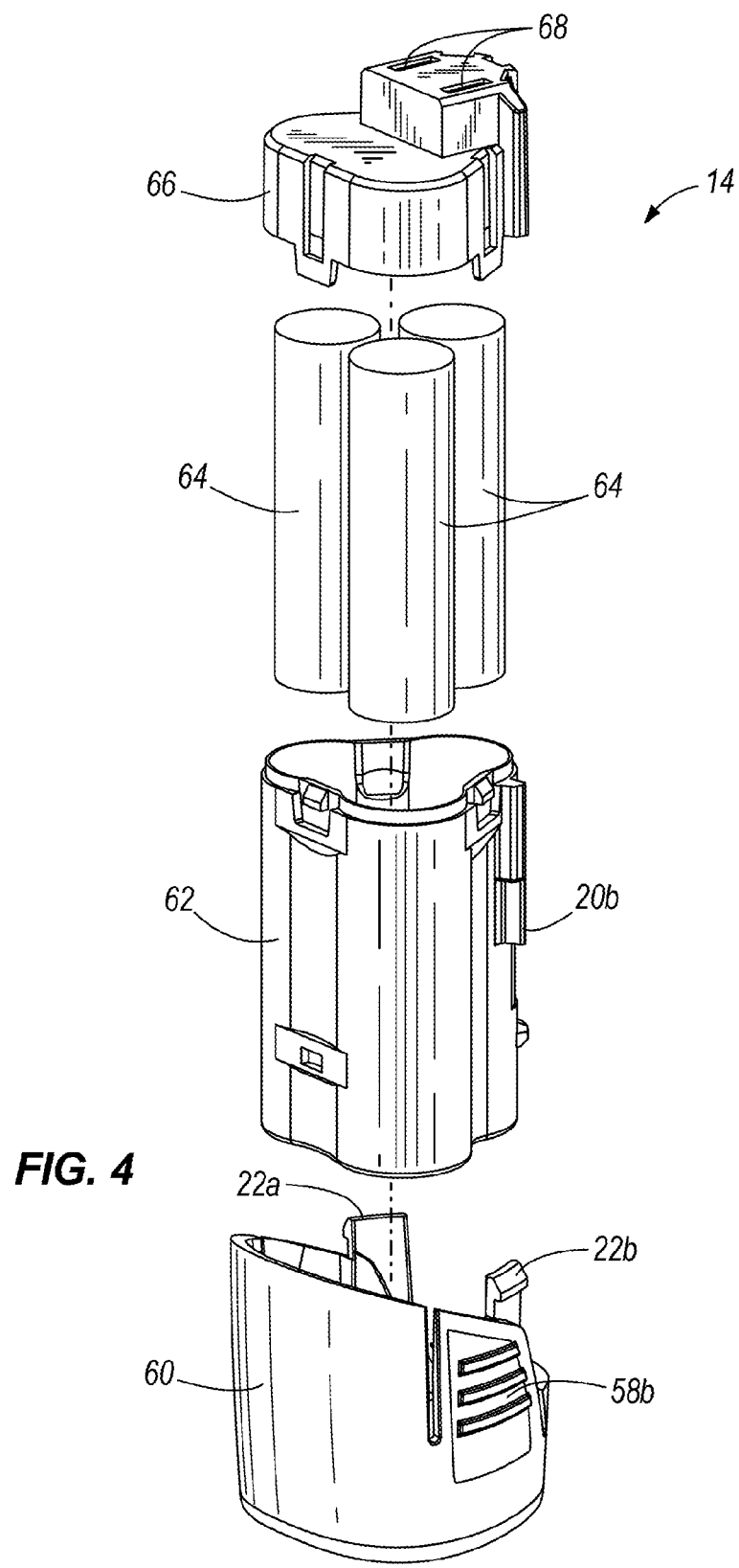
FIG. 4 is an exploded perspective view of the battery pack of FIG. 3.
Figure 5:
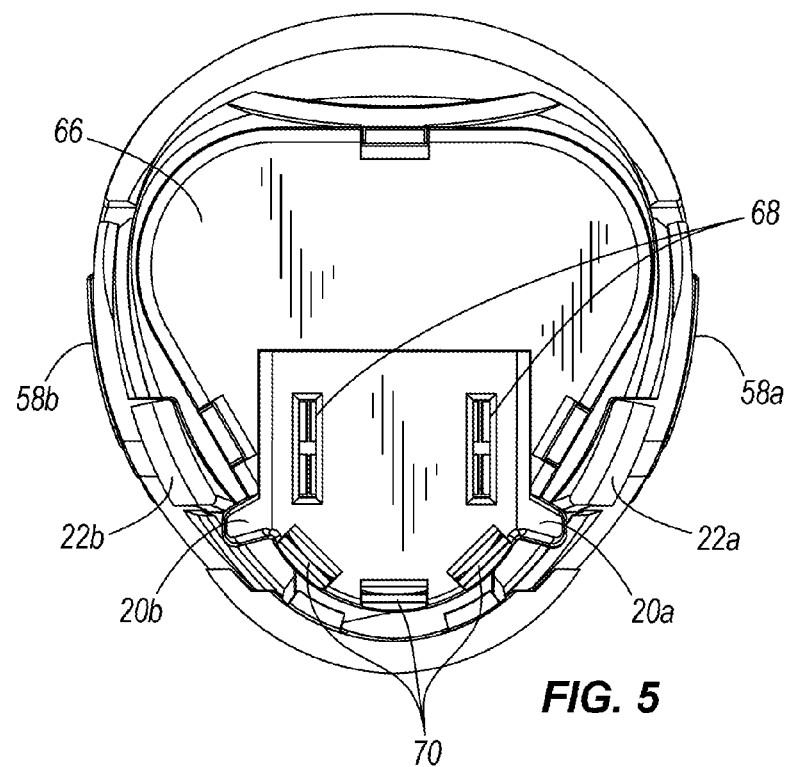
FIG. 5 is a top view of the battery pack of FIG. 3.

As shown in FIG. 4, the battery pack 14 includes three battery cells 64 positioned within the casing 62 and electrically coupled to the terminals 40. The battery cells 64 provide operational power (e.g., DC power) to the tool 10. In the illustrated construction, the battery cells 64 are arranged in series, and each battery cell 64 has a nominal voltage of approximately four-volts (4.0V), such that the battery pack 14 has a nominal voltage of approximately twelve-volts (12V). The cells 32 also have a capacity rating of approximately 1.4 Ah. In other constructions, the battery pack 14 may include more or fewer battery cells 64, and the cells 64 can be arranged in series, parallel, or a series and parallel combination. For example, the pack 14 can include a total of six battery cells 64 in a parallel arrangement of two sets of three series-connected cells 64. The series-parallel combination of battery cells creates a battery pack having a nominal voltage of approximately 12V and a capacity rating of approximately 2.8 Ah. In other constructions, the battery cells 64 may have different nominal voltages, for example, 3.6V, 3.8V, 4.2V, etc., and/or may have different capacity ratings, for example, 1.2 Ah, 1.3 Ah, 2.0 Ah, 2.4 Ah, 2.6 Ah, 3.0 Ah, etc. In other constructions, the battery pack 14 can have a different nominal voltage, for example, 10.8V, 14.4V, etc. In the illustrated construction, the battery cells 64 are lithium-ion battery cells having a chemistry of, for example, lithium-cobalt (Li—Co), lithium-manganese (Li—Mn), or Li—Mn spinel. In other constructions, the battery cells 64 may have other suitable lithium or lithium-based chemistries.

With particular reference to FIGS. 6-8, the battery pack 14 includes a pair of rails 20a, 20b extending from the battery pack 14. The spring arms 24a, 24b of the biasing member 24 engage the rails 20a, 20b, respectively, to form the primary locking engagement mechanism to releasably secure the battery pack 14 to the tool 10.

In the illustrated construction, two actuators 58a, 58b and two latches 22a, 22b are formed in the outer housing 60 of the battery pack 14. The latch contact surfaces 26a, 26b of the tool 10 engage the respective latches 22a, 22b if the biasing member 24 disengages, e.g., breaks, is released or otherwise fails to provide a locking engagement between the battery pack 14 and the tool 10. Thus, the latches 22a, 22b form the secondary locking engagement mechanism to releasably secure the battery pack 14 to the tool 10. Each latch 22aa, 22b engages the corresponding latch contact surface 26a, 26b formed in the tool 10 to secure the battery pack 14 in place if the biasing member 24 fails to provide a locking engagement. The latches 22a, 22b are normally biased away from the casing 62 (i.e., away from each other) when squeezed together due to the resiliency of the material forming the outer housing 60. Actuating (e.g., depressing) the actuators 58a, 58b moves the latches 22aa, 22b toward the casing 62 (i.e., toward each other) to clear the respective latch contact surface 26a, 26b such that the battery pack 14 may be pulled out of engagement with the biasing member 24, out of the cavity 16 and away from the tool 10. Such an arrangement allows a user to quickly remove the battery pack 14 from the tool 10 for recharging or replacement without the use of tools.

In operation, a user inserts the battery pack 14 in alignment with the chamfers 56 of the tool 10. Insertion of the battery pack 14 into the cavity 16 causes the biasing member 24 to deform radially outwards against the biasing force of the biasing member 24 as the rails 20a, 20b slidingly engage the projections 44a, 44b, respectively, of the biasing member 24. When the battery pack 14 is fully inserted, the spring arms 24a, 24b are partially relieved as the projections 44a, 44b are aligned with and extend into a clearance adjacent the rails 20. The projections 44a, 44b engage the ends of the rails 20a, 20b to retain the battery pack 14 in the tool 10. When the biasing member 24 is in engagement with the battery pack 14 to hold the battery pack 14 in place, then a small clearance exists between the latches 22a, 22b and the latch contact surfaces 26a, 26b such that the latches 22a, 22b are not in locking engagement with the latch contact surfaces 26a, 26b. If the biasing member 24 disengages (e.g., fails, etc.), then the latches 22a, 22b engage the latch contacting surfaces 26a, 26b to retain the battery pack 14 in the tool 10. The rubber pads 54 provide a cushion to dampen vibrations transmitted from the tool 10 to the battery pack 14.

To remove the battery pack 14, the user depresses the actuators 58a, 58b to move the latches 22a, 22b toward the casing 62 (i.e., toward each other) to clear the latch contact surfaces 26a, 26b as the user pulls the battery pack 14 out of the cavity 16. With the actuators 58a, 58b depressed, the battery pack 14 may be pulled out of engagement with the biasing member 24, out of the cavity 16 and away from the tool 10. The chamfers 56 inhibit the user from being able to twist the battery pack 14 while removing the battery pack 14 from the tool 10.

Although the invention has been described in detail with reference to preferred constructions, variations and modifications exist within the scope and spirit of one or more independent aspects of the invention as described.

Thus the invention provides, among other things, a battery retention system for a power tool. Various features and advantages of the invention are set forth in the following claims.

What is claimed is:

1. A battery retention system for a power tool having a motor, a drive mechanism coupled to the motor, and an output element coupled to the drive mechanism, the battery retention system comprising:
   a battery pack for powering the motor, wherein the battery pack is removably coupled to the power tool;
   a spring configured for coupling the battery pack to the power tool in locking engagement to provide power to the power tool, wherein the spring deforms against the battery pack when the battery pack is fully inserted to reduce transmission of vibrations to the battery pack; and
   a latch configured for coupling the battery pack to the power tool in locking engagement to provide power to the power tool independently from the spring as a backup to the spring;
   wherein the latch is not in locking engagement when the spring is in locking engagement.

2. The battery retention system of claim 1, wherein the latch is configured to couple the battery pack to the power tool in locking engagement to provide power to the power tool when the spring fails to provide locking engagement.

3. The battery retention system of claim 1, further comprising:
- a rail disposed on one of the battery pack or the power tool;
- wherein the spring includes a spring arm disposed on the other of the battery pack or the power tool, wherein the spring arm engages the rail to retain the battery pack on the power tool.

4. The battery retention system of claim 3,
- wherein the latch is formed on one of the battery pack or the power tool; and
- wherein the battery retention system further comprises a latch-receiving recess formed on the other of the battery pack or the power tool;
- wherein the latch is received in the latch-receiving recess to retain the battery pack on the power tool.

5. The battery retention system of claim 4, wherein the recess includes a depth measured in the direction of insertion of the battery into the power tool, wherein the depth is dimensioned to provide a clearance between the latch and the recess in the direction of insertion when the battery pack is fully inserted in the power tool and the first mating feature is in locking engagement.

6. The battery retention system of claim 1, further comprising a cushion disposed between the battery pack and the power tool for cushioning the battery pack against vibrations of the power tool.

7. The battery retention system of claim 1, further comprising a cavity for receiving the battery pack and a chamfer at an edge of the cavity leading into the cavity.

8. A battery retention system for a power tool and a battery pack, the power tool having a motor, a drive mechanism coupled to the motor, and an output element coupled to the drive mechanism, the battery retention system comprising:
- a latch receiving recess for receiving a latch in locking engagement, the latch receiving recess at least partially defined by a latch contact surface; and
- a mating feature independent from the latch receiving recess and configured for coupling the battery pack to the power tool in locking engagement to provide power to the power tool;
- wherein the latch receiving recess is configured such that the latch contact surface is spaced from the latch, so as to not engage the latch, when the mating feature is in locking engagement; and
- wherein the mating feature is releasable together with release of the latch for removing the battery pack from the power tool.

9. The battery retention system of claim 8, further comprising a cavity for receiving the battery pack, wherein the mating feature includes a protrusion in the cavity.

10. The battery retention system of claim 9, wherein the mating feature includes at least one spring arm protruding into the cavity for engaging the battery pack.

11. The battery retention system of claim 8, wherein the mating feature includes at least one spring arm having a projection for engaging rails of the battery pack.

12. The battery retention system of claim 8, wherein the mating feature includes a generally U-shaped spring including two spring arms for engaging opposite rails of the battery pack.

13. The battery retention system of claim 8, wherein the latch contact surface is a first latch contact surface, the battery retention system further comprising a second latch contact surface generally opposite the first latch contact surface, wherein the mating feature is disposed spaced from and in between the first and second latch contact surfaces.

14. The battery retention system of claim 8, further comprising an elastic pad for cushioning the battery pack against vibrations of the power tool.

* * * * *